US011644514B2

United States Patent
Furukawa et al.

(10) Patent No.: US 11,644,514 B2
(45) Date of Patent: May 9, 2023

(54) DETERIORATION AMOUNT ESTIMATION DEVICE, ENERGY STORAGE SYSTEM, DETERIORATION AMOUNT ESTIMATION METHOD, AND COMPUTER PROGRAM

(71) Applicant: GS Yuasa International Ltd., Kyoto (JP)

(72) Inventors: Kazuki Furukawa, Kyoto (JP); Hiroki Matsui, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 0 days.

(21) Appl. No.: 16/651,904

(22) PCT Filed: Oct. 2, 2018

(86) PCT No.: PCT/JP2018/036893
§ 371 (c)(1),
(2) Date: Mar. 27, 2020

(87) PCT Pub. No.: WO2019/069929
PCT Pub. Date: Apr. 11, 2019

(65) Prior Publication Data
US 2020/0264238 A1 Aug. 20, 2020

(30) Foreign Application Priority Data

Oct. 3, 2017 (JP) .............................. JP2017-193715

(51) Int. Cl.
*G01R 31/392* (2019.01)
*H01M 10/42* (2006.01)
*H01M 10/48* (2006.01)

(52) U.S. Cl.
CPC ...... *G01R 31/392* (2019.01); *H01M 10/4285* (2013.01); *H01M 10/48* (2013.01)

(58) Field of Classification Search
CPC .. G01R 31/392; G01M 10/4285; G01M 10/48
See application file for complete search history.

(56) References Cited

U.S. PATENT DOCUMENTS 5,631,533 A 5/1997 Imaseki
9,435,866 B2 * 9/2016 Takahashi ............ G01R 31/396
(Continued)

FOREIGN PATENT DOCUMENTS

JP H07-255133 A 10/1995
JP 2009-123435 A 6/2009
(Continued)

OTHER PUBLICATIONS

International Search Report (ISR) (PCT Form PCT/ISA/210), in PCT/JP2018/036893, dated Dec. 25, 2018.

*Primary Examiner* — Raymond L Nimox
(74) *Attorney, Agent, or Firm* — McGinn I.P. Law Group, PLLC.

(57) ABSTRACT

A deterioration amount estimation device includes a calculation unit (CPU33) that calculates a deterioration amount of an energy storage device and an estimation unit (CPU33) that estimates a transient deterioration amount based on a deterioration amount calculated by the calculation unit and a continuous deterioration amount that does not decrease with time and continues. The transient deterioration amount is estimated, and the input/output of the energy storage device is limited to suppress an increase in the continuous deterioration amount.

19 Claims, 9 Drawing Sheets

(56) References Cited

U.S. PATENT DOCUMENTS

| | | |
|---|---|---|
| 2010/0145644 A1 | 6/2010 | Honkura |
| 2010/0241376 A1 | 9/2010 | Kikuchi et al. |
| 2012/0310571 A1* | 12/2012 | Takagi ................. G01R 31/392 |
| | | 702/65 |
| 2013/0282316 A1* | 10/2013 | Goto ................... H01M 10/486 |
| | | 702/63 |
| 2015/0301118 A1* | 10/2015 | Tao ....................... H01M 10/48 |
| | | 702/63 |
| 2017/0371000 A1 | 12/2017 | Fukushima et al. |
| 2018/0006335 A1* | 1/2018 | Fujita .................. H01M 10/425 |
| 2018/0053971 A1 | 2/2018 | Matsui et al. |
| 2018/0076633 A1* | 3/2018 | Fujita .................... H01M 10/46 |
| 2018/0261893 A1* | 9/2018 | Fujita .................... H02J 7/0021 |
| 2020/0292619 A1* | 9/2020 | Tohara ............... G01R 31/3828 |

FOREIGN PATENT DOCUMENTS

| | | |
|---|---|---|
| JP | 2010-060408 A | 3/2010 |
| JP | 2010-139260 A | 6/2010 |
| JP | 2013-044580 A | 3/2013 |
| JP | 2013-051115 A | 3/2013 |
| JP | 2015-025751 A | 2/2015 |
| JP | 2015-158416 A | 9/2015 |
| WO | WO 2016/079964 A1 | 5/2016 |
| WO | WO 2016/159086 A1 | 10/2016 |
| WO | WO-2016159086 A1 * | 10/2016 ............. H01M 4/13 |

\* cited by examiner

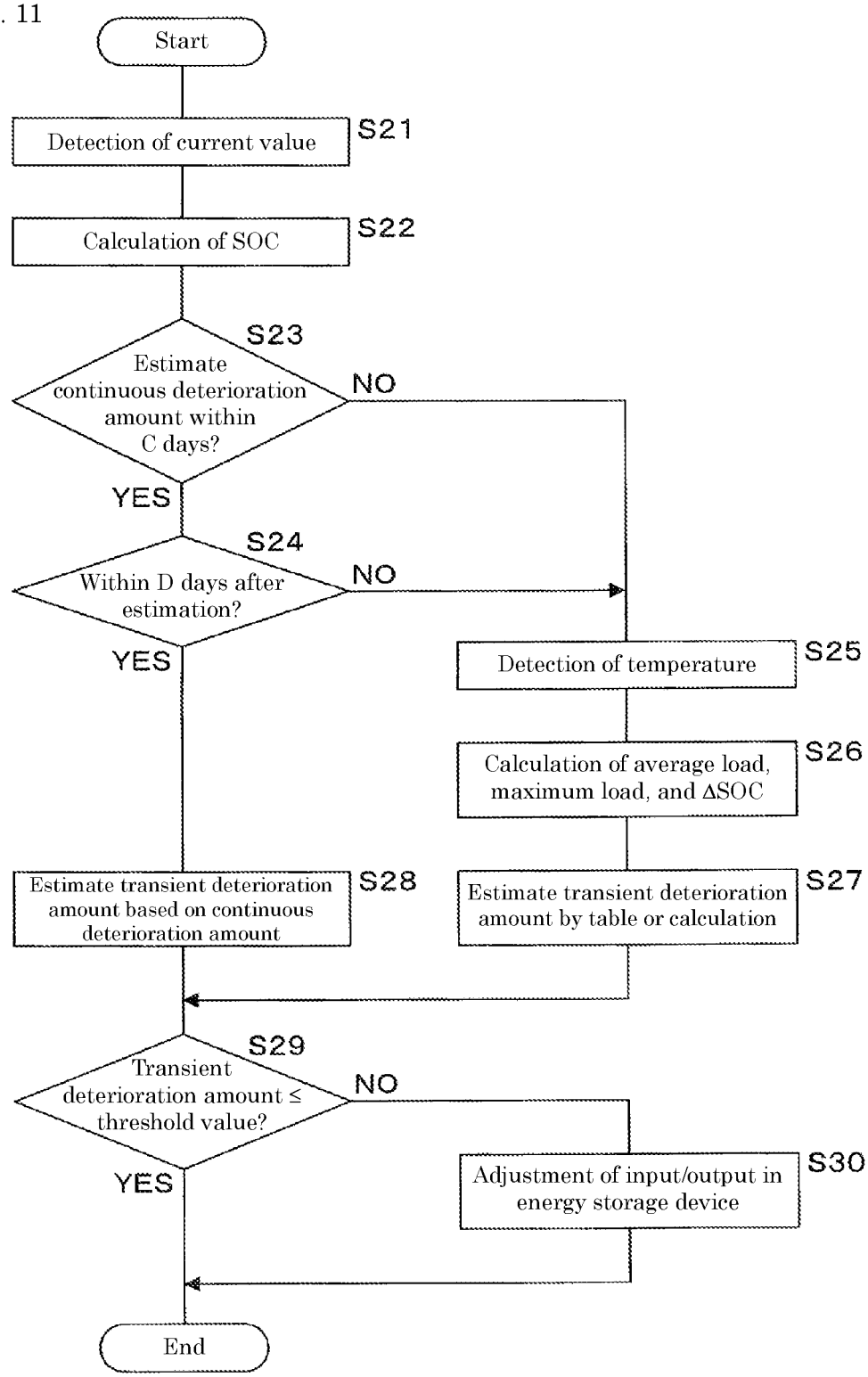

DETERIORATION AMOUNT ESTIMATION DEVICE, ENERGY STORAGE SYSTEM, DETERIORATION AMOUNT ESTIMATION METHOD, AND COMPUTER PROGRAM

TECHNICAL FIELD

The present invention relates to a deterioration amount estimation device for estimating a deterioration amount of a chargeable/dischargeable energy storage device, an energy storage system, a deterioration amount estimation method, and a computer program.

BACKGROUND ART

Charge-discharge control devices that control charge-discharge of secondary batteries for vehicles used in electric vehicles (EV), hybrid vehicles (HEV), etc., and industrial secondary batteries used in power storage apparatuses, solar power generating systems, etc. are known.

The charge-discharge control device disclosed in Patent Document 1 includes a discharge control unit that stops discharge when a voltage falls below a predetermined reference value during discharge, a charge control unit that stops charge when a voltage exceeds a predetermined reference value during charge, and a history estimation unit that estimates a history of a battery (charge-discharge cycle number, the number of cycles) based on the state of the battery. The discharge control unit corrects (increases) the reference value for stopping discharge according to a history estimation value by the history estimation unit, and the charge control unit corrects (decreases) the reference for stopping charge according to a history estimation value by the history estimation unit.

PRIOR ART DOCUMENT

Patent Document

Patent Document 1: JP-A-7-255133

SUMMARY OF THE INVENTION

Problems to be Solved by the Invention

The charge-discharge control device disclosed in Patent Document 1 is configured to correct a reference voltage value for stopping discharge and a reference voltage value for stopping charge based on only the estimated value of the history of the secondary battery (the charge-discharge cycle number, the number of cycles). For this reason, the deterioration of the secondary battery may not be able to be suppressed depending on the magnitude or the like of the current at the time of charge-discharge of the secondary battery.

The inventors of the present application have found that deterioration (decrease in power performance) of an energy storage device includes transient deterioration (transient decrease in power performance) and continuous deterioration (continuous decrease in power performance). The transient deterioration is a transient deterioration phenomenon caused by depletion of the electrolyte solution in the electrode due to bias of ions in the electrolyte solution due to charge and discharge. The transient deterioration is recovered when the load becomes low, in which the deterioration phenomenon does not occur. When the amount of transient deterioration increases, continuous deterioration that does not recover even when the energy storage device is in a low-load state occurs.

An object of the present invention is to provide a deterioration amount estimation device, an energy storage system, a deterioration amount estimation method, and a computer program that can satisfactorily estimate a transient deterioration amount and suppress an increase in a continuous deterioration amount.

Means for Solving the Problems

A deterioration amount estimation device according to one aspect of the present invention includes a calculation unit that calculates a deterioration amount of an energy storage device, and an estimation unit that estimates a transient deterioration amount based on the deterioration amount and a continuous deterioration amount that does not decrease (recover) with time and continues.

Advantages of the Invention

According to one aspect of the present invention, the transient deterioration amount is estimated based on the calculated deterioration amount and the continuous deterioration amount. An increase in the continuous deterioration amount can be suppressed by extracting the transient deterioration amount from the deterioration amount and performing input/output limitation such as limiting the application target of the energy storage device.

BRIEF DESCRIPTION OF THE DRAWINGS

FIG. 11 is a flowchart showing a processing procedure for estimating a transient deterioration amount and controlling transient deterioration by the CPU according to a second embodiment.

MODE FOR CARRYING OUT THE INVENTION

Figure 1:
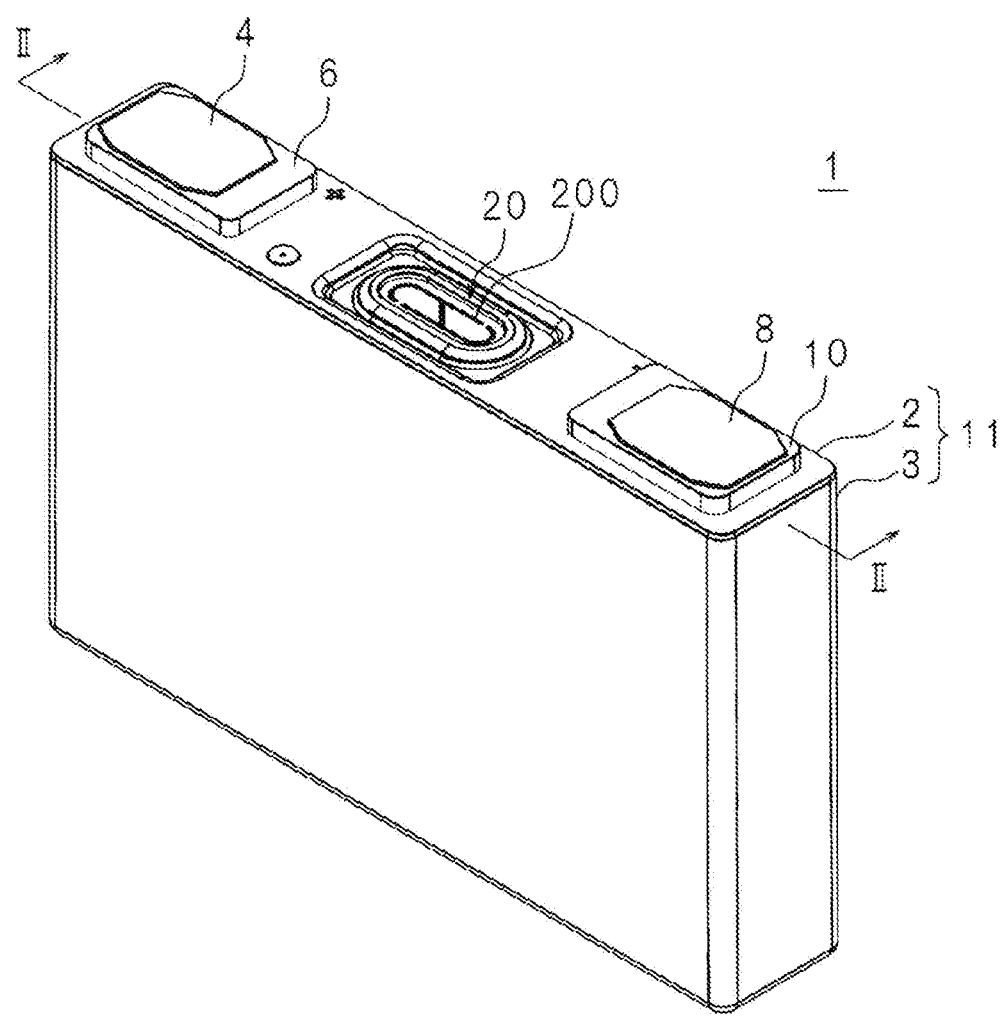
FIG. 1 is a perspective view of an energy storage device according to a first embodiment.

Hereinafter, the present invention will be specifically described with reference to the drawings showing the embodiments. (Overview of the present embodiment)

The deterioration amount estimation device according to one embodiment includes a calculation unit that calculates a deterioration amount of an energy storage device, and an estimation unit that estimates a transient deterioration amount based on the deterioration amount and a continuous deterioration amount that does not decrease with time and continues.

According to the above configuration, the transient deterioration amount is estimated based on the calculated deterioration amount and the continuous deterioration amount. When the degree of the transient deterioration increases, the continuous deterioration accelerates. By quantifying the transient deterioration and limiting the input/output of the energy storage device, it is possible to suppress an increase in the continuous deterioration amount. Therefore, the life of the energy storage device (or energy storage apparatus) can be extended.

A deterioration amount estimation device according to another embodiment includes a first calculation unit that calculates a calculated deterioration amount of an energy storage device, and a first estimation unit that estimates a transient deterioration amount based on a calculated deterioration amount at a calculation time point, and a calculated deterioration amount at a predetermined time point.

The calculation time point is an arbitrary time point when the calculated deterioration amount is calculated.

According to the above configuration, based on the calculated deterioration amount at the calculation time point and the calculated deterioration amount at a predetermined time point after the calculation time point, for example, an increase amount, a rate, and the like of the deterioration amount are obtained, so that the transient deterioration amount is estimated, and the transient deterioration amount can be controlled.

The above-described deterioration amount estimation device further includes a second calculation unit that calculates an internal resistance value of the energy storage device, and the first calculation unit may calculate a calculated deterioration amount based on the internal resistance value calculated by the second calculation unit.

According to the above configuration, the calculated deterioration amount can be easily obtained from the increase amount of the internal resistance value.

In the above-described deterioration amount estimation device, the predetermined time point is a time point when, in a case where the load is smaller than a predetermined value, a reduction time in which the calculated deterioration amount decreases and a decrease amount converges has elapsed, a second estimation unit that estimates a continuing continuous deterioration amount based on the calculated deterioration amount calculated by the first calculation unit at the time point is included, and the first estimation unit may estimate the transient deterioration amount based on the calculated deterioration amount at the calculation time point and the continuous deterioration amount.

"The case where the load is smaller than a predetermined value" refers to a case where the load is small enough not to affect the transient deterioration, and includes a case where there is no load.

"The decrease amount converges" means that decrease in the transient deterioration amount converges.

According to the above configuration, the calculated deterioration amount when the reduction time has elapsed is estimated as the continuous deterioration amount. Since the continuous deterioration amount does not decrease with time and continues, the transient deterioration amount obtained based on the calculated deterioration amount and the continuous deterioration amount is controlled so that the increase in the continuous deterioration amount can be satisfactorily suppressed.

In the above-described deterioration amount estimation device, the second estimation unit may estimate the continuous deterioration amount when a predetermined period has elapsed and the load is smaller than the predetermined value.

As described above, since the continuous deterioration amount does not decrease and continues, the transient deterioration amount can be estimated based on the calculated deterioration amount and the continuous deterioration amount. However, in the long run, the continuous deterioration amount increases. An interval (predetermined period) for estimating the continuous deterioration amount is set in consideration of an allowable error or the like in estimating the transient deterioration amount. That is, the transient deterioration amount can be accurately estimated by updating the continuous deterioration amount when a predetermined period has elapsed since the last time when the continuous deterioration amount was calculated.

The above-described deterioration amount estimation device may include a setting unit that sets the reduction time based on a use condition of the energy storage device and a predetermined convergence value of the decrease amount.

According to the above configuration, the transient deterioration amount can be realistically and accurately estimated by approximately setting the reduction time based on the usage condition of the energy storage device and the predetermined convergence value of the decrease amount.

An energy storage system according to another embodiment includes an energy storage device, one of the above-described deterioration amount estimation devices, and an adjusting unit that adjusts an amount of current to be input/output in the energy storage device such that the transient deterioration amount of the energy storage device is equal to or less than a predetermined value.

According to the above configuration, by estimating and controlling the transient deterioration amount, it is possible to suppress an increase in the continuous deterioration amount.

The deterioration amount estimation device according to another embodiment includes a calculation unit that calculates a deterioration amount of the energy storage device, and an estimation unit that estimates a continuous deterioration amount based on the deterioration amount calculated by the calculation unit at a time point when, in a case where the load of the energy storage device is smaller than a predetermined value, a reduction time in which the deterioration amount decreases and a reduction amount converges has elapsed.

According to the above configuration, the continuous deterioration amount can be satisfactorily estimated, and the internal state of the energy storage device can be estimated.

The deterioration amount estimation method according to another embodiment calculates a deterioration amount of an energy storage device and estimates a transient deterioration amount based on the calculated deterioration amount and a continuous deterioration amount that does not decrease with time and continues.

A computer program according to another embodiment causes a computer to execute a process of calculating a deterioration amount of an energy storage device and estimating a transient deterioration amount based on the calculated deterioration amount and a continuous deterioration amount that does not decrease with time and continues.

According to the above configuration, the transient deterioration amount is estimated based on the calculated deterioration amount and the continuous deterioration amount. By quantifying the transient deterioration and limiting the input/output of the energy storage device, it is possible to suppress an increase in the continuous deterioration amount.

A deterioration amount estimation method according to another embodiment calculates a calculated deterioration amount of an energy storage device, and estimates a transient deterioration amount based on the calculated deterioration amount at a calculation time point and the calculated deterioration amount at a predetermined time point.

A computer program according to another embodiment causes a computer to execute a process of calculating a calculated deterioration amount of an energy storage device and estimating a transient deterioration amount based on the calculated deterioration amount at a calculation time point and the calculated deterioration amount at a predetermined time point.

According to the above configuration, the transient deterioration amount can be estimated based on the calculated deterioration amount at the calculation time point and the calculated deterioration amount at the predetermined time point, and the transient deterioration amount can be controlled.

First Embodiment

Figure 2:
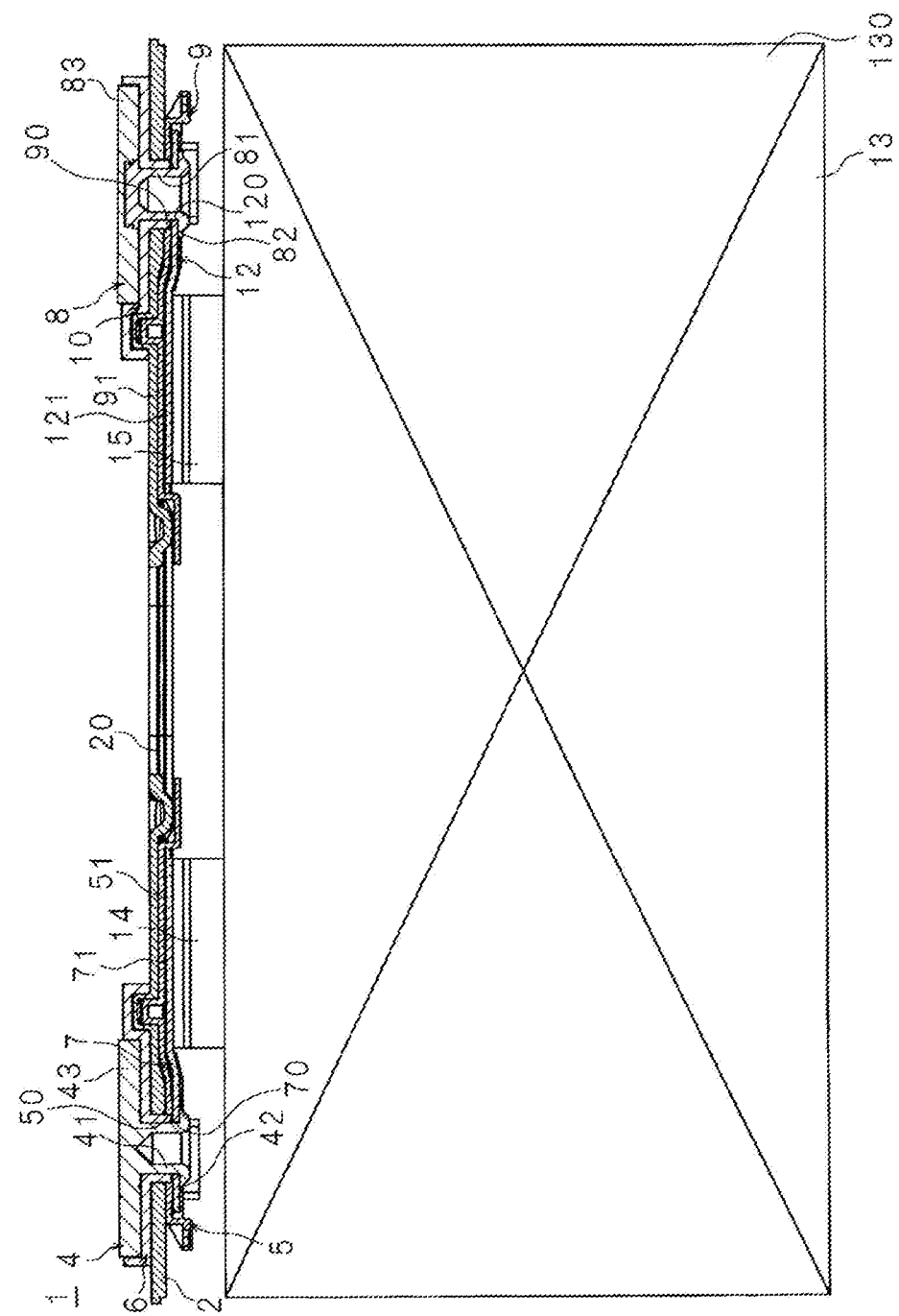
FIG. 2 is a cross-sectional view taken along line II-II of FIG. 1.

FIG. 1 is a perspective view of an energy storage device (hereinafter, referred to as a battery) 1 according to a first embodiment, and FIG. 2 is a cross-sectional view taken along line II-II of FIG. 1. Hereinafter, the case where the battery 1 is a lithium ion secondary battery will be described, but the battery 1 is not limited to the lithium ion secondary battery.

The battery 1 includes a case 11 having a cover plate 2 and a case body 3, a positive electrode terminal 4, insulating plates 5, 9, a negative electrode terminal 8, gaskets 6, 10, a rupture valve 20, current collectors 7, 12, and an electrode assembly 13.

The case 11 is made of, for example, a metal such as aluminum, an aluminum alloy, and stainless steel, or a synthetic resin, has a rectangular parallelepiped shape, and accommodates the electrode assembly 13 and an electrolyte solution (not shown).

As shown in FIG. 2, the positive electrode terminal 4 includes a shaft portion 41 penetrating the cover plate 2, a swaged portion 42 for swaging one end of the shaft portion 41, and a plate portion 43 provided at one end of the shaft portion 41.

The gasket 6 is made of, for example, a synthetic resin such as polyphenylene sulfide (PPS) or polypropylene (PP). The positive electrode terminal 4 has the inner surface of the plate portion 43 and the shaft portion 41 covered with the gasket 6, and penetrates the cover plate 2 in an insulated state.

The insulating plate 5 is made of, for example, a synthetic resin such as PPS or PP, and includes an insertion hole 50 through which an end of the shaft portion 41 is inserted, and a storage portion 51 that stores a joining portion 71 described below.

The current collector 7 is, for example, a plate-shaped aluminum, is disposed on the inner surface of the cover plate 2, and has an insertion hole 70 through which an end of the shaft portion 41 is inserted. The current collector 7 has the joining portion 71 projecting outward from another portion and joining a positive electrode tab 14 on the center side of the cover plate 2.

The negative electrode terminal 8 includes a shaft portion 81 penetrating the cover plate 2, a swaged portion 82 for swaging one end of the shaft portion 81, and a plate portion 83 provided on the other end of the shaft portion 81. The negative electrode terminal 8 has the inner surface of the plate portion 83 and the shaft portion 81 covered with a gasket 10 made of, for example, PPS or PP, and penetrates the cover plate 2 in an insulated state.

The insulating plate 9 is made of, for example, a synthetic resin such as PPS or PP, and includes an insertion hole 90 through which an end of the shaft portion 81 is inserted, and a storage portion 91 that stores a joining portion 121 described below.

The current collector 12 has a plate shape and is made of, for example, copper, and is disposed on an inner surface of the cover plate 2 and has an insertion hole 120 through which an end of the shaft portion 81 is inserted. The current collector 12 has a joining portion 121 projecting outward from another portion and joining a negative electrode tab 15 on the center side of the cover plate 2.

The electrode assembly 13 is a lamination type that includes a main body 130 in which a plurality of positive and negative electrode plates are alternately stacked with a separator interposed therebetween to form a rectangular parallelepiped, and a positive electrode tab 14 and a negative electrode tab 15 extending from the main body 130 to the cover plate 2 side.

The electrode assembly 13 may be obtained by winding a positive electrode plate and a negative electrode plate in a flat shape via a separator.

The positive electrode plate is made of, for example, aluminum and has a band-shaped or rectangular plate-shaped metal foil and a positive active material layer formed on the metal foil.

The positive active material is a lithium metal oxide. The positive active material may be a two-phase reaction type active material. Specifically, the positive active material is a material represented by the general formula $LiMPO_4$, and M may be any one of Fe, Mn, Cr, Co, Ni, V, Mo, and Mg.

The positive active material may be a polyanion compound ($LiaFebPO_4$, $LiaMnbPO_4$, $LiaMnbSiO_4$, $LiaCobPO_4F$, or the like) represented by $LiaMeb(XOc)d$ (Me represents one or more transition metals, X represents, for example, P, Si, B, V) including a two-phase coexisting reaction type. The positive active material may be a composite oxide ($LixCoO_2$, $LixNiO_2$, $LixMnO_4$, $LixNiyMnzCo(1-y-z)O_2$, or the like) represented by $LixMeOp$ (Me represents one or more transition metals).

The negative electrode plate is made of, for example, copper and has a band-shaped or rectangular plate-shaped metal foil and a negative active material layer formed on the metal foil.

The negative active material is a carbon material. Specifically, the negative active material may be any one of graphite, easily graphitizable carbon, hardly graphitizable carbon, and the like.

The deterioration amount estimation device of the present embodiment is provided in, for example, an energy storage apparatus 30 of an HEV vehicle driven by an engine and a motor, or an EV vehicle.

Figure 3:
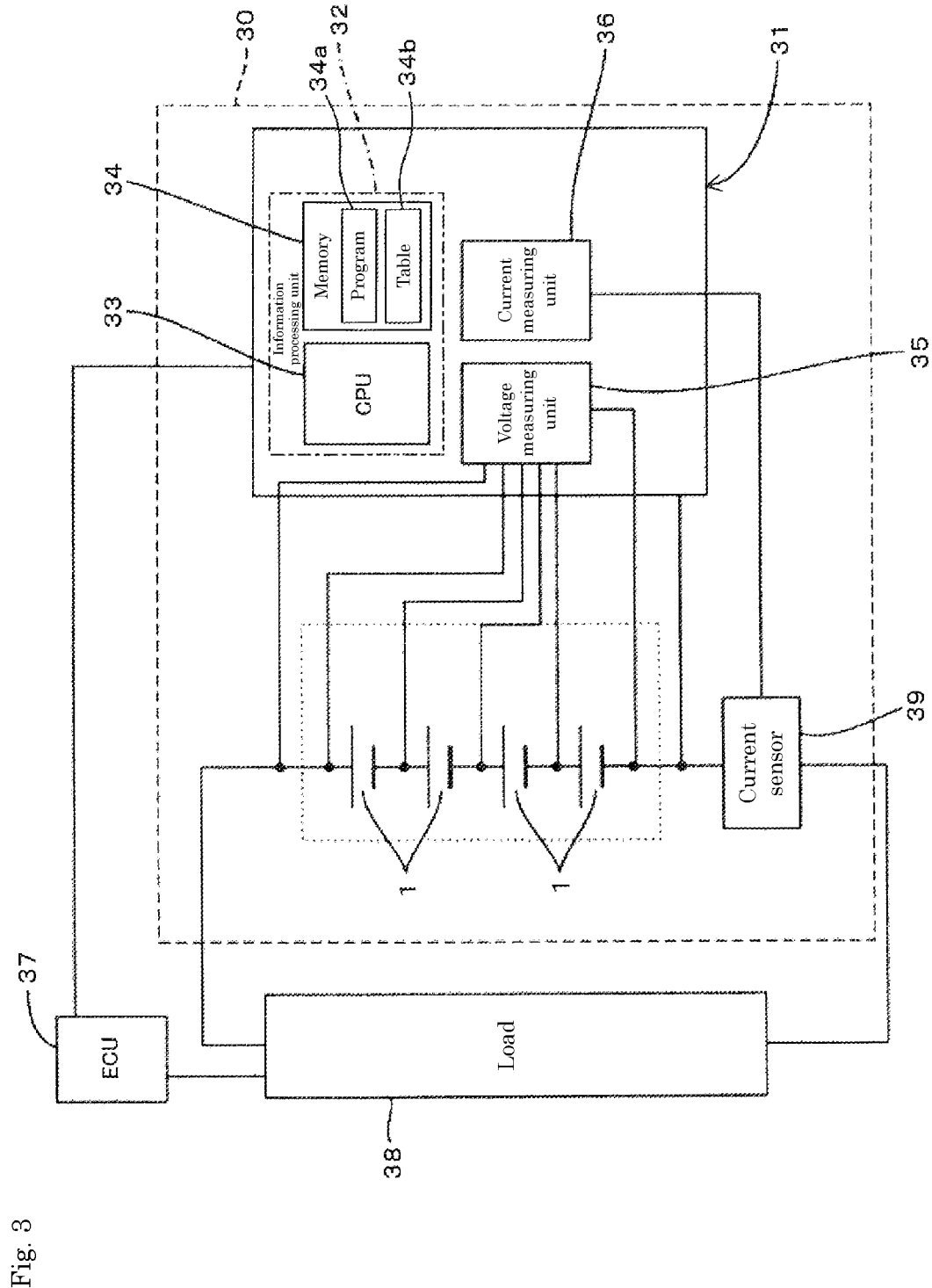
FIG. 3 is a block diagram of an energy storage apparatus.

FIG. 3 is a block diagram of the energy storage apparatus 30.

The energy storage apparatus 30 includes a plurality of batteries 1, a battery management unit (BMU) 31, and a current sensor 39. The BMU 31 includes an information processing unit 32 having a CPU 33 and a memory 34, a voltage measuring unit 35, and a current measuring unit 36. The BMU 31 corresponds to the deterioration amount estimation device according to the present embodiment.

The memory 34 stores various programs 34a including a continuous deterioration amount estimation program, a transient deterioration amount estimation program, and a transient deterioration amount control program according to the present embodiment, and a table 34b. The table 34b stores the sampled current value, voltage value, estimated continuous deterioration amount and transient deterioration amount.

The CPU 33 executes a process of estimating a continuous deterioration amount and a transient deterioration amount and a process of controlling a transient deterioration amount described below in accordance with the program 34a read from the memory 34.

The voltage measuring unit 35 is connected to both ends of the batteries 1 via voltage detection lines, respectively, and measures the voltage value of each battery 1 at predetermined time intervals.

The current measuring unit 36 measures a current value flowing through the battery 1 via the current sensor 39 at predetermined time intervals.

An external terminal (not shown) of the energy storage apparatus 30 is connected to a load 38 such as a starter motor for starting the engine and electric components.

The BMU 31 and the load 38 are connected to an ECU (Electronic Control Unit) 37.

The deterioration of the battery 1 includes transient deterioration and continuous deterioration. When the transient deterioration amount increases, continuous deterioration that does not recover even when the battery 1 enters a low-load state occurs. The low-load state refers to a state in which a low current that does not affect transient deterioration flows, including also a no-current state, and may be a no-load state after ignition-off (IG-off). The vehicle is system-started by ignition-on (IG-on) to supply power to each part of the vehicle, and the vehicle is system-stopped by IG-off to stop the power supply.

The transient deterioration is a recoverable decrease in power performance, and is a transient deterioration phenomenon caused by depletion of the electrolyte solution in the electrode due to the bias of ions in the electrolyte solution associated with charge and discharge.

If the potential of the negative active material layer of the electrode assembly 13 becomes lower than the deposition potential during charging of the battery 1, metal deposition occurs in the negative active material layer, and the deterioration of the battery 1 proceeds rapidly. The potential of the negative active material layer of the electrode assembly 13 and the deposition potential change according to the state of charge of the battery 1, the charging time of the battery 1, the current input to the battery 1, the temperature of the battery 1, and the like. Under a use environment in which a large current flows into the battery 1, metal deposition easily occurs in the negative active material layer. Under low temperature environment (25° C. or less. In particular, at 0° C. or lower), metal deposition easily occurs in the negative active material layer. When the state of charge of the battery 1 is high (when the SOC is 50% or more), metal deposition easily occurs in the negative active material layer. The above-mentioned deterioration due to metal deposition also corresponds to transient deterioration.

Local deterioration of the electrode and electrolyte solution due to transient deterioration affects continuous deterioration.

Figure 4:
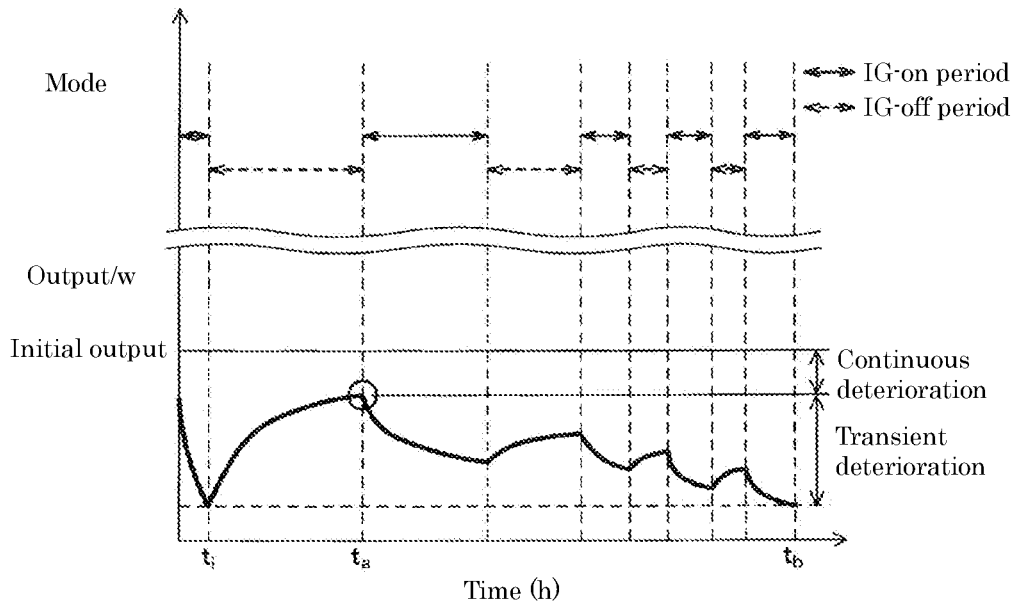
FIG. 4 is a graph showing a relationship between an ignition on (IG-on) and an ignition off (IG-off) and a change in power performance.

FIG. 4 is a graph showing a relationship between IG-on and IG-off and a change in power performance.

As shown in FIG. 4, after IG-on is performed, the load is applied to the energy storage device, so that the power performance is lower than the initial power performance. After IG-off is performed, the energy storage device is put into the no-load state, and thereby the power performance is recovered. When the IG-off period (reduction time to be described later) is sufficiently long, a recovery amount (an increase amount of output) of the output greatly reduced at a time point $t_i$ in FIG. 4 converges to substantially zero. The power performance degradation that remains without recovery at a time point $t_a$ corresponds to the continuous deterioration. After the continuous deterioration amount is estimated, during a period (between $t_b$ and $t_a$) where the continuous deterioration does not increase, the difference between the deterioration amount (power performance degradation rate) and the continuous deterioration amount at a certain time point (calculation time point) corresponds to the transient deterioration amount. Although the description is made based on the IG-on state or the IG-off state, a low-load state may be used instead of the IG-off state.

In the present embodiment, the deterioration amount is quantified by the internal resistance value. The degradation in power performance is caused by an increase in the internal resistance value.

The internal resistance value can be obtained by calculating the slope of the I-V characteristic between the current value I and the voltage value V stored in the table 34b by the least square method. Since the calculation of the internal resistance value is greatly affected by the SOC and the temperature, it is preferable to correct the internal resistance value to a value at the same SOC and temperature. In order to increase the accuracy of calculating the internal resistance value, it is conceivable to shorten the sampling interval of the current value I and the voltage value V, multiply by a forgetting coefficient, or change the weight for each parameter.

The deterioration amount (calculated deterioration amount) is calculated by the following equation.

Deterioration amount=(current internal resistance value)−(initial internal resistance value)

As the initial internal resistance value, there is an internal resistance value when a vehicle runs for the first time immediately after the battery 1 is mounted on the vehicle. It may be obtained by flowing a current after the battery 1 is manufactured.

Figure 5:
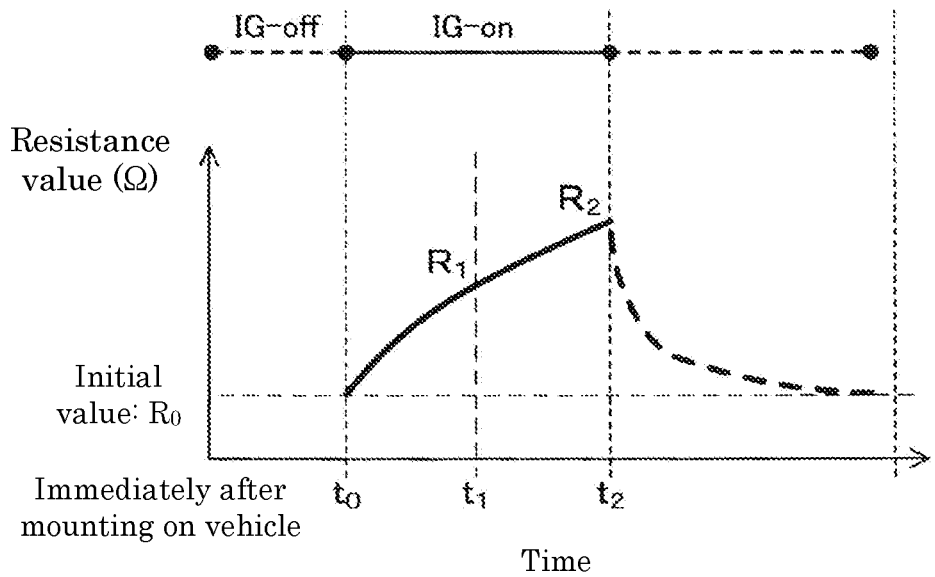
FIG. 5 is a graph showing a relationship between an elapsed time immediately after mounting on a vehicle and an internal resistance value.

FIG. 5 is a graph showing the relationship between the elapsed time immediately after the battery 1 is mounted on the vehicle and the internal resistance value. The horizontal axis represents an elapsed time, and the vertical axis represents a resistance value (internal resistance value: Ω).

When IG-on is performed immediately after the battery 1 is mounted and running is started, the internal resistance value increases as shown in FIG. 5. The internal resistance value at a running start time point to is an initial value $R_0$. Since the battery 1 has just been mounted on the vehicle, continuous deterioration has not occurred in the battery 1.

The difference between the internal resistance value at a certain time point after the start of running and the initial value $R_0$ corresponds to the transient deterioration amount.

The transient deterioration amount at a time point $t_1$ is represented by a difference $(R_1-R_0)$ between the internal resistance values $R_1$ and $R_0$.

The transient deterioration amount at a time point $t_2$ is represented by a difference $(R_2-R_0)$ between the internal resistance values $R_2$ and $R_0$.

When IG-off is performed at the time point $t_2$, the increase amount in resistance decreases.

In FIG. 5, the decrease in the resistance value is indicated by a broken line, but since the resistance value cannot be acquired during the IG-off period, it is shown as an image.

Figure 6:
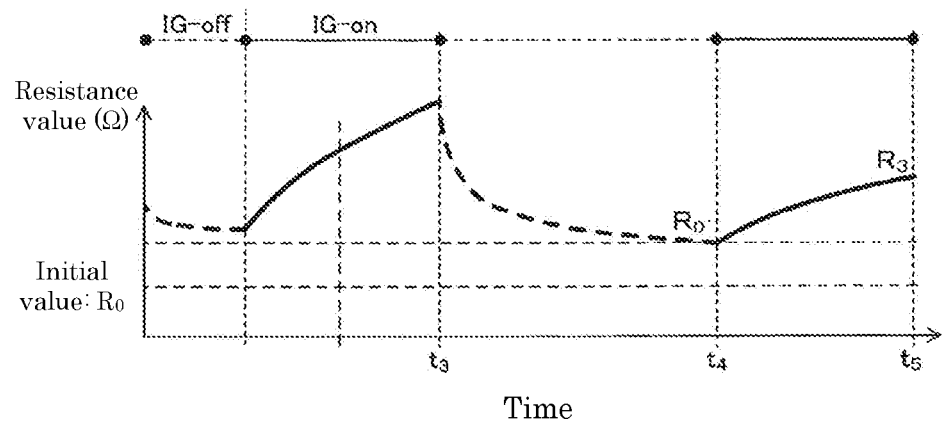
FIG. 6 is a graph showing a relationship between an elapsed time and an internal resistance value when IG-off, IG-on, IG-off, and IG-on are repeated.

FIG. 6 is a graph showing the relationship between the elapsed time and the internal resistance value when IG-off, IG-on, IG-off, and IG-on are repeated. The horizontal axis represents an elapsed time, and the vertical axis represents a resistance (internal resistance value: Ω).

After a time point $t_3$ when IG-off is performed for the second time, the internal resistance value decreases, and at a time point $t_4$, the decrease amount converges to substantially zero. That is, at this time point, the transient deterioration has disappeared. At the time point $t_4$, the difference $(R_0'-R_0)$ between the internal resistance values $R_0'$ and $R_0$ acquired when IG-on is performed corresponds to the continuous deterioration amount. Thereafter, the internal resistance value increases due to IG-on, and the difference $(R_3-R_0')$ between the internal resistance values $R_3$ and $R_0'$ calculated at a time point $t_5$ corresponds to the transient deterioration amount. The transient deterioration amount is a difference between the deterioration amount $(R_3-R_0)$ at the time point $t_5$ and the continuous deterioration amount.

The time between the time point $t_4$ and the time point $t_3$ is defined as the reduction time.

Figure 7:
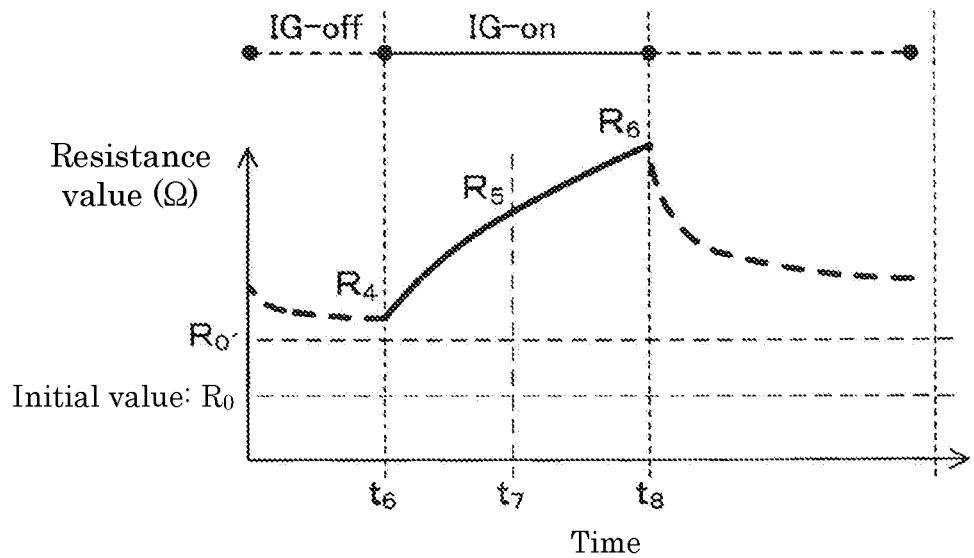
FIG. 7 is a graph showing a relationship between an elapsed time and an internal resistance value when IG-off, IG-on, and IG-off are repeated after quantifying a continuous deterioration amount.

FIG. 7 is a graph showing the relationship between the elapsed time and the internal resistance value when IG-off, IG-on, and IG-off are repeated after quantifying the continuous deterioration amount. The horizontal axis represents an elapsed time, and the vertical axis represents a resistance value (internal resistance value: Ω).

The continuous deterioration amount is $(R_0'-R_0)$ quantified in FIG. 7.

The transient deterioration amount at a time point $t_6$ is represented by a difference $(R_4-R_0')$ between the internal resistance values $R_4$ and $R_0'$.

The transient deterioration amount at a time point $t_7$ is represented by a difference $(R_5-R_0')$ between the internal resistance values $R_5$ and $R_0'$.

The transient deterioration amount at a time point $t_8$ is represented by a difference $(R_6-R_0')$ between the internal resistance values $R_6$ and $R_0'$.

The reduction time is preferably a time during which the transient deterioration amount completely disappears.

However, it may not be practical to maintain a no-load state until the transient deterioration amount completely disappears.

Therefore, the reduction time can be approximated as follows.

Assuming that the daily traveling distance of approximately 90% of car users is 50 km or less and the average speed is 30 km/h, the traveling time can be estimated to be 1.5 hours or less.

In a design vehicle where transient deterioration is likely to occur, transient deterioration of 2% (increasing rate of internal resistance value) occurs at 25° C. and a traveling time of 14 hours. If the traveling time is 1.5 hours, it is considered that 0.2% transient deterioration occurs.

Figure 8:
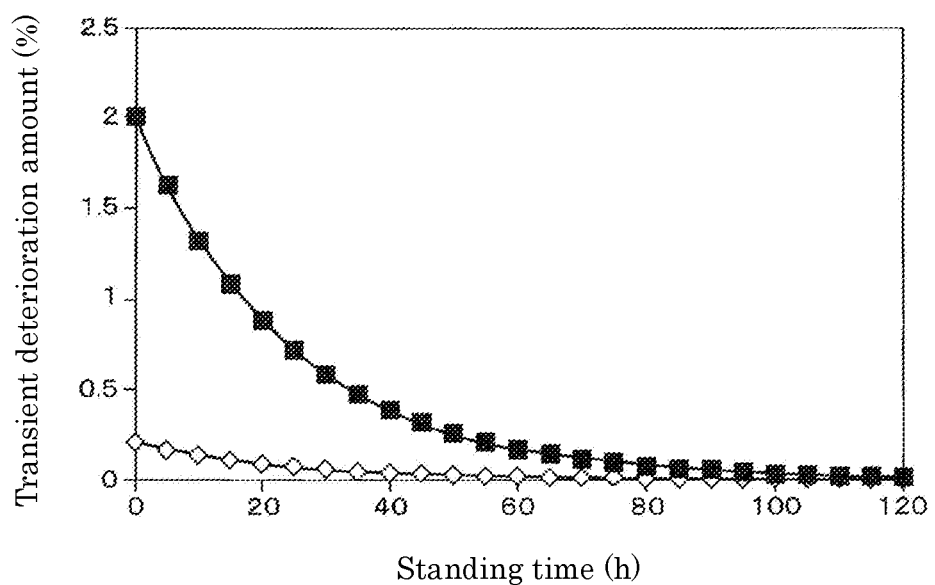
FIG. 8 is a graph showing the result of examining a relationship between a standing time after IG-off and a transient deterioration amount.

Running tests were performed with the time interval (cycle time) from IG-on to IG-off set to 14 hours and 1.5 hours, and the relationship between the standing time after IG-off and the transient deterioration amount was examined. The results are shown in the graph of FIG. 8. The horizontal axis represents a standing time (h), and the vertical axis represents a transient deterioration amount (%). In FIG. 8, ◇ indicates a case where the cycle time is 1.5 hours and the transient deterioration amount immediately after the cycle is 0.2%, and □ indicates a case where the cycle time is 14 hours and the transient deterioration amount immediately after the cycle is 2%.

From FIG. 8, after 24 hours, the transient deterioration amount falls below 0.1%, and the transient deterioration amount and the continuous deterioration amount can be quantified with an accuracy within 0.1%.

In this case, the CPU 33 (setting unit) sets the approximate reduction time to 24 hours. The continuous deterioration amount may be calculated by subtracting 0.1% from the deterioration amount calculated after the elapse of 24 hours.

Similarly, the CPU 33 can calculate the approximate reduction time based on the relationship between the standing time after IG-off and the transient deterioration amount. The arithmetic expression is as follows.

$$y = A \cdot \exp(-x/\tau)$$

Where y: transient deterioration amount
x: time
A: correction coefficient
τ: time constant The CPU 33 examines the relationship between the standing time after IG-off and the transient deterioration amount under a plurality of charge-discharge conditions, obtains a table or a function that associates the charge-discharge conditions (use conditions) with the relationship between the standing time and the transient deterioration amount in advance, and can obtain the approximate reduction time with reference to the table or by the function, based on the most recently acquired charge-discharge conditions.

The process of estimating the continuous deterioration amount by the CPU 33 will be described.

Figure 9:
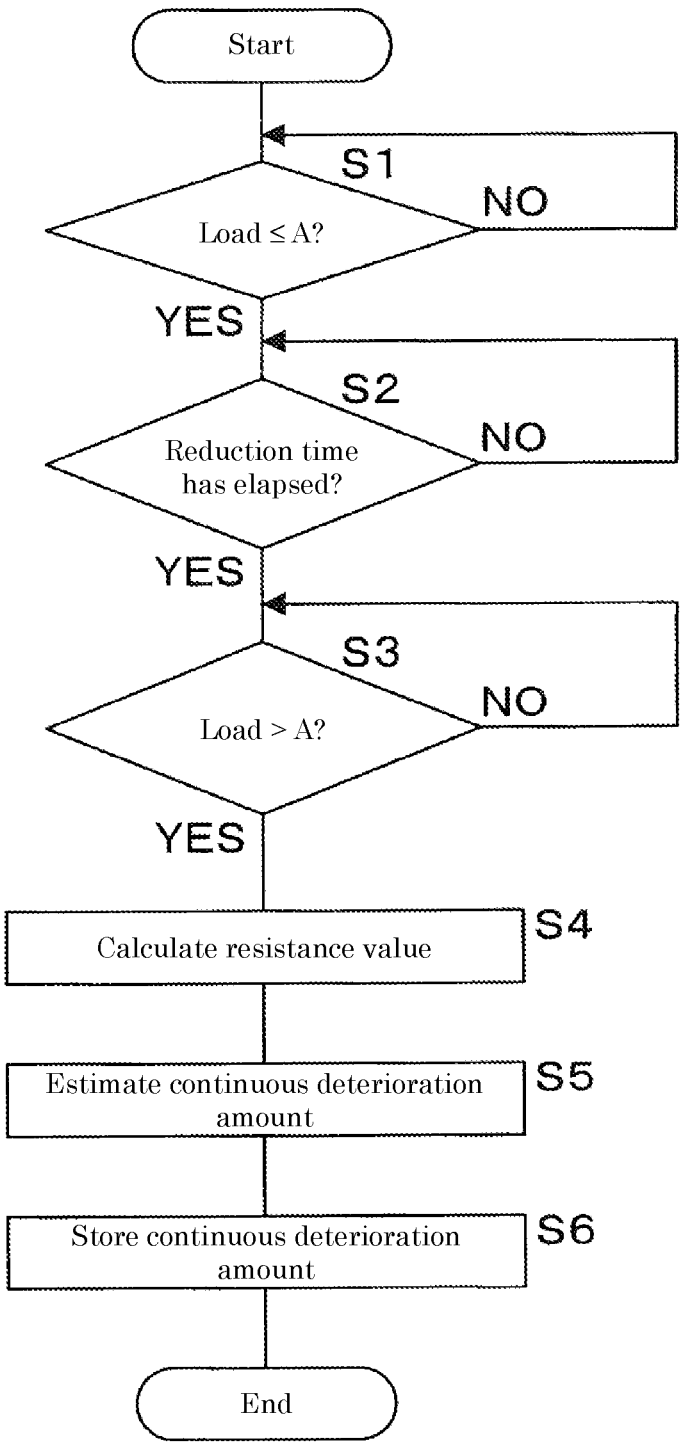
FIG. 9 is a flowchart showing a processing procedure for estimating a continuous deterioration amount by a CPU.

FIG. 9 is a flowchart showing a processing procedure of estimating the continuous deterioration amount by the CPU 33. The CPU 33 performs this process when a predetermined period D has elapsed.

The predetermined period D is the number of days during which continuous deterioration occurs. The rate of increase of the internal resistance value is less than 0.01%/day. In a case where a threshold value of transient deterioration control described later is assumed to be 2%, if the estimation error of the transient deterioration amount can be allowed up to 10% of the threshold value (transient deterioration amount 0.2%), the transient deterioration amount can be estimated for twenty days after estimating the continuous deterioration amount. In this case, D is twenty days. That is, D is set based on the rate of increase in the internal resistance value of the battery 1 per day, an allowable error in estimation of the transient deterioration amount, and the like.

First, the CPU 33 determines whether or not the current flowing through the load is equal to or smaller than a threshold value A (A: ampere) (S1). The CPU 33, when having determined that the current flowing through the load is not equal to or smaller than the threshold value A (A) (S1: NO), repeats this determination process.

The CPU 33, when having determined that the current flowing through the load is equal to or smaller than the threshold value A (A) (S1: YES), determines whether or not the reduction time has elapsed (S2). The reduction time may be a time during which the transient deterioration amount completely disappears, or may be an approximate reduction time. The CPU 33, when having determined that the reduction time has not elapsed (S2: NO), repeats this determination process.

The CPU 33, when having determined that the reduction time has elapsed (S2: YES), determines whether or not the current flowing through the load is greater than the threshold value A (A) (S3). The CPU 33, when having determined that the current flowing through the load is not greater than the threshold value A (A) (S3: NO), repeats this determination process.

The CPU 33, when having determined that the current flowing through the load is greater than the threshold value A (A) (S3: YES), calculates a resistance value (S4). As shown in FIG. 6, the CPU 33 calculates the internal resistance value $R_0'$ based on the current value and the voltage value acquired when the current flowing through the load becomes greater than the threshold value A.

The CPU 33 estimates the continuous deterioration amount from $R_0'-R_0$ (S5). The reduction time is an approximate reduction time. As shown in FIG. 8, when the convergence value of the decrease amount during the approximate reduction time (remaining transient deterioration amount, 0.1% in FIG. 8) is known, the continuous deterioration amount is a value obtained by subtracting the convergence value from the deterioration amount at the time point when the approximate reduction time has elapsed.

The CPU 33 stores the continuous deterioration amount in the table 34b (S6).

Figure 10:
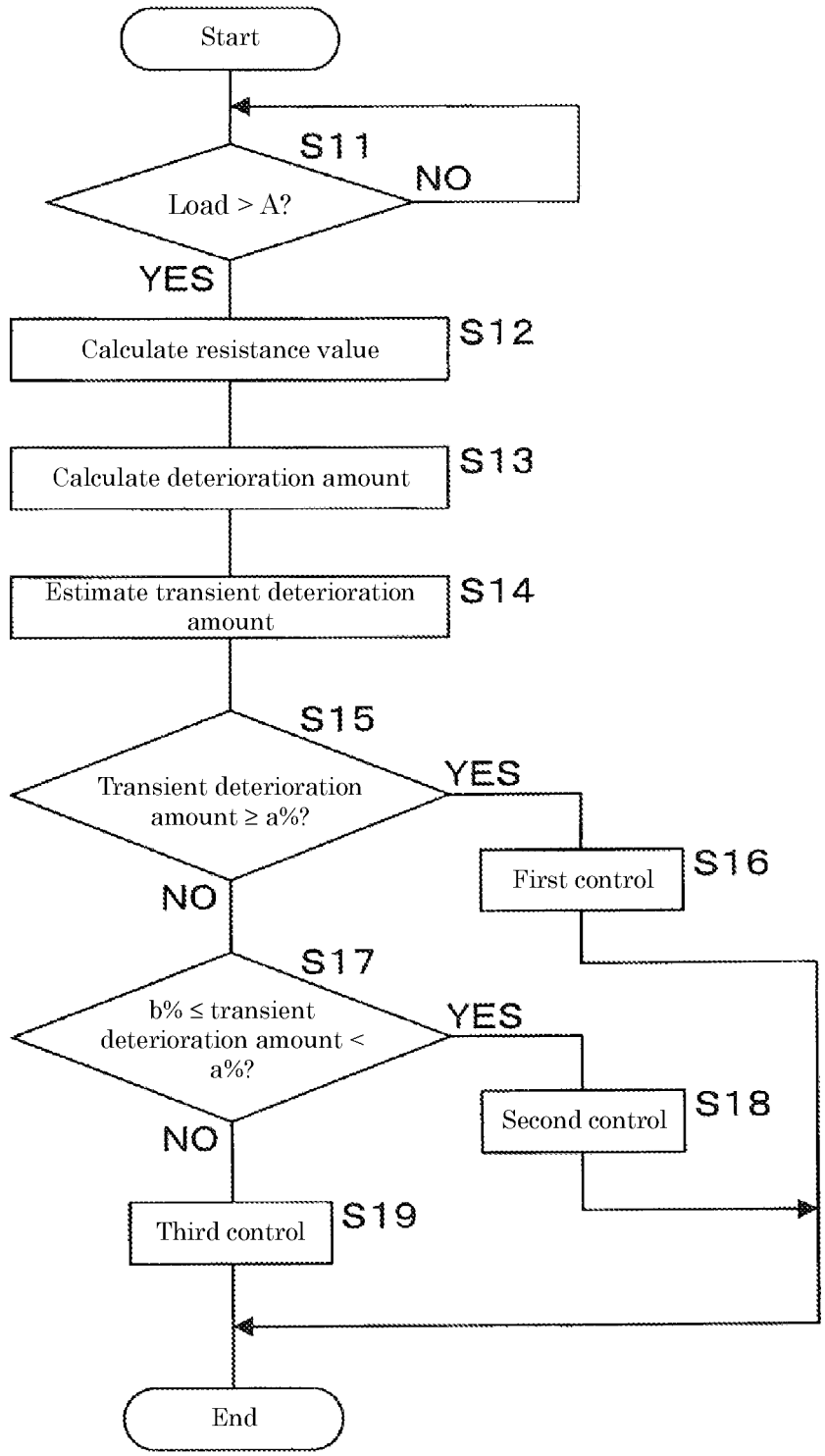
FIG. 10 is a flowchart showing a processing procedure for estimating a transient deterioration amount and controlling transient deterioration by the CPU.

FIG. 10 is a flowchart showing a processing procedure of estimating the transient deterioration amount and controlling the transient deterioration by the CPU 33. The CPU 33 performs the following process at appropriate intervals or at any timing.

The CPU 33 determines whether or not the current flowing through the load is greater than the threshold value A (A) (S11). The CPU 33, when having determined that the current flowing through the load is not greater than the threshold value A (A) (S11: NO), repeats this determination process.

The CPU 33, when having determined that the current flowing through the load is greater than the threshold value A (A) (S11: YES), calculates an internal resistance value (S12).

The CPU 33 calculates a deterioration amount based on the internal resistance value (S13). As shown in FIG. 7, (internal resistance value−initial value) is the deterioration amount.

The CPU 33 estimates the transient deterioration amount based on the difference between the calculated deterioration amount and the continuous deterioration amount (S14).

The CPU 33 determines whether or not the transient deterioration amount is equal to or more than a % (S15).

The CPU 33, when having determined that the transient deterioration amount is equal to or more than a % (S15: YES), performs the first control (S16) and ends the process.

The CPU 33, when having determined that the transient deterioration amount is not equal to or more than a % (S15: NO), determines whether or not the transient deterioration amount is equal to or more than b % and less than a % (S17). The CPU 33, when having determined that the transient deterioration amount is equal to or more than b % and less than a % (S17: YES), performs the second control (S18) and ends the process.

The CPU 33, when having determined that the transient deterioration amount is not equal to or more than b % and not less than a % (S17: NO), performs the third control (S19) and ends the process.

Specific values of a % and b % include 5% and 2%.

When the transient deterioration amount is 5% or more, in the first control, the maximum load is adjusted by changing the current value input/output in the battery 1. Actively reduce a usage rate of the battery 1 and increase a usage rate of the engine. The application targets of the battery 1 in the first control include electric stabilizers, defoggers, sensing of driving support systems, automatic driving, and the like, communication devices (automatic braking, coasting), and auxiliary machine systems of electrical components such as immobilizers, keyless entries, and room lights.

The first control suppresses shortening of the life of the battery 1 and metal deposition in the negative active material layer.

When the transient deterioration amount is 2% or more and less than 5%, as the second control, the use of the battery 1 is partially limited.

The application targets of the battery 1 include, in the case of auxiliary machine system, air conditioners, electric stabilizers, defoggers, sensing of driving support systems, automatic driving, and the like, communication devices (automatic braking, coasting), and auxiliary machine systems of electrical components such as immobilizers, keyless entries, and room lights. In the case of the drive system, auxiliary load and restart during battery idling stop, regeneration at deceleration, electric turbocharger, low-speed EV traveling (parking, congestion), and the like can be mentioned.

The second control suppresses shortening of the life of the battery 1 and metal deposition in the negative active material layer.

When the transient deterioration amount is less than 2%, as the third control, the usage rate of the battery 1 is positively increased only for a short time.

The application targets of the battery 1 include, in the case of auxiliary machine system, air conditioners, electric stabilizers, defoggers, sensing of driving support systems, automatic driving, and the like, communication devices (automatic braking, coasting), and auxiliary machine systems of electrical components such as immobilizers, keyless entries, and room lights. In the case of the drive system, EV traveling, starting, auxiliary load and restart during battery idling stop, regeneration at deceleration, electric boost (motor assist), electric turbocharger, low-speed EV traveling (parking, congestion), and the like can be mentioned.

The third control improves fuel efficiency and power performance, and also suppresses metal deposition in the negative active material layer.

As described above, in the present embodiment, the continuous deterioration amount can be satisfactorily estimated based on the deterioration amount calculated when the reduction time has elapsed, and the internal state of the battery 1 can be satisfactorily grasped.

The transient deterioration amount is estimated (quantified) based on the calculated deterioration amount and the continuous deterioration amount, the application target of the battery 1 is limited, and the input/output is limited, so that the increase in the continuous deterioration amount can be satisfactorily suppressed. Therefore, shortening of the life of the battery 1 is suppressed.

Since the continuous deterioration amount increases in the long term, the transient deterioration amount can be accurately estimated by updating the continuous deterioration amount after a predetermined period has elapsed.

By approximately setting the reduction time based on the use condition of the battery 1 and a predetermined convergence value of the decrease amount, the transient deterioration amount can be estimated realistically and accurately.

Second Embodiment

In the CPU 33 according to the second embodiment, when the continuous deterioration amount has not been estimated within C days, or when it has not been updated within D days, the transient deterioration amount is estimated by another method.

FIG. 11 is a flowchart showing a processing procedure of estimating the transient deterioration amount and controlling the transient deterioration by the CPU 33. The CPU 33 executes the following process at a predetermined interval or at an arbitrary timing.

The CPU 33 detects the current value (S21).

The CPU 33 calculates the SOC of the battery 1 based on the detected current value (S22).

The CPU 33 determines whether or not the continuous deterioration amount has been estimated within C days (S23). The C days are, for example, thirty days.

The CPU 33, when having determined that the continuous deterioration amount has not been estimated within C days (S23: NO), advances the process to S25.

The CPU 33, when having determined that the continuous deterioration amount has been estimated within C days (S23: YES), estimates the continuous deterioration amount and then determines whether or not it is within D days (S24). Here, the D days are, for example, twenty days.

The CPU 33, when having determined that it is not within D days (S24: NO) after estimating the continuous deterioration amount, advances the process to S25.

The CPU 33 detects the temperature of the battery 1 in S25 (S25).

The CPU 33 calculates an average load, a maximum load, and ΔSOC based on the detected current value and temperature (S26).

The average load is an average current value (time average value of the charge current and the discharge current) in a time interval from the IG-on time point to the time point of estimating the transient deterioration amount of the battery 1, and is a value that is reset when IG-off is performed.

When the battery 1 is mounted on a vehicle, the maximum load is the maximum current value in a time interval from the IG-on time point to the time point of estimating the transient deterioration amount of the battery 1, and is a value that is reset when IG-off is performed.

ΔSOC is the difference between the maximum SOC and the minimum SOC in a time interval from the IG-on time point to the time point of estimating the transient deterioration amount of the battery 1, and is a value that is reset when IG-off is performed.

The CPU 33 estimates the transient deterioration amount by a table or calculation (S27).

In S27, the transient deterioration amount is indicated not by the increase amount of the internal resistance value but by the decrease amount (%) of the power performance.

The table 34*b* stores a first table, a second table, and a third table.

The first table is data in which the average load of the battery 1, the temperature of the battery 1, and the transient deterioration amount of the battery 1 corresponding to each value of the average load and the temperature are associated with each other. The second table is data in which the maximum load of the battery 1, the temperature of the battery 1, and the transient deterioration amount of the battery 1 corresponding to each value of the maximum load and the temperature are associated with each other. The third table is data in which ΔSOC, the temperature of the battery 1, and the transient deterioration amount of the battery 1 corresponding to each value of ΔSOC and the temperature are associated with each other.

The CPU 33 refers to the first table, the second table, and the third table, acquires the first transient deterioration amount, the second transient deterioration amount, and the third transient deterioration amount respectively corresponding to the obtained average load, maximum load, and ΔSOC and to the detected temperature, and estimates the transient deterioration amount based on the sum of these.

Alternatively, the CPU 33 estimates the transient deterioration amount by the following equation.

$$D=\alpha(T)\cdot A+\beta(T)\cdot B+\gamma(T)\cdot C-K(T)\cdot E+D\text{stop}$$

Here, A is the maximum load, B is the average load, C is ΔSOC, E is the rest time (time interval from IG-on to IG-off), and T is the temperature of the battery 1. $\alpha(T)$ is a coefficient relating to the maximum load, $\beta(T)$ is a coefficient relating to the average load, and $\gamma(T)$ is a coefficient relating to ΔSOC. $\alpha(T)$, $\beta(T)$, and $\gamma(T)$ are coefficients whose values increase as the time interval (cycle time) from IG-on to IG-off increases. $K(T)$ is a relaxation coefficient, and Dstop is a value of the transient deterioration amount immediately before the vehicle stops.

After estimating the transient deterioration amount, the CPU 33 advances the process to S29.

The CPU 33, when having determined that it is within D days (S24: YES) after estimating the continuous deterioration amount, estimates the transient deterioration amount similarly to the first embodiment (S28).

In S29, the CPU 33 determines whether or not the transient deterioration amount is equal to or less than a threshold value.

The threshold value is, for example, 2%. The CPU 33, when having determined that the transient deterioration amount is not equal to or less than the threshold value (S29: NO), changes the current value input/output in the battery 1 by a preset value to adjust the maximum load, for example (S30).

The CPU 33, when having determined that the transient deterioration amount is equal to or less than the threshold value (S29: YES), ends the process.

A plurality of the above-described threshold values may be set similarly to the first embodiment, a plurality of controls of the transient deterioration amount may be set, and control corresponding to the relationship between the transient deterioration amount and each threshold value may be performed.

In the present embodiment, at the update timing of the continuous deterioration amount within C days, in a case where the reduction time or the approximate reduction time cannot be secured at the time of IG-off and the continuous deterioration amount cannot be updated, or D days have elapsed after the update, the transient deterioration amount is estimated by another method. In the above case, when the transient deterioration amount is estimated by the method, and the continuous deterioration amount was updated, since the transient deterioration amount is estimated based on the calculated deterioration amount and the continuous deterioration amount, the transient deterioration amount can always be accurately estimated.

The deterioration amount estimation device, the energy storage apparatus, and the deterioration amount estimation method of the present invention are not limited to the first embodiment and the second embodiment, and various changes may be made within a range not departing from the gist of the present invention.

The energy storage device in the first embodiment and the second embodiment is a nonaqueous electrolyte secondary battery, specifically, a lithium ion battery, but the energy storage device is not limited to a lithium ion secondary battery. The energy storage device may be a battery other than the lithium ion secondary battery or a capacitor that causes transient deterioration similar to that of the lithium ion secondary battery. The energy storage device may be any device that causes transient deterioration, and the application is not limited to the in-vehicle use. In the embodiment, as an example of determining whether or not the energy storage device is in a low-load state when mounted on a vehicle, it is determined whether the state is IG-on state (loaded state) or IG-off state (no-load state). For other applications, the determination may be made based on the threshold value of the current value.

The threshold value of the transient deterioration amount is also not limited to the value of the embodiment.

In the first and second embodiments, the case where the BMU 31 is a deterioration amount estimation device is described, but the ECU 37 may be a deterioration amount estimation device.

The energy storage system of the present invention is not limited to the energy storage apparatus 30 described above. A deterioration amount estimation device and/or an adjusting unit may be provided outside the energy storage apparatus. The energy storage system is not limited to being mounted on an HEV or an EV but may be mounted on a PHEV, and is not limited to a vehicle but may be mounted on a moving body such as a train, a ship, an aircraft, or the like. It is also not limited to being mounted on the moving body.

The present invention is also applicable to a moving body with dual power sources. For example, in the case of a vehicle, an alternator, a starter motor, a lead-acid battery (auxiliary energy storage device or auxiliary energy storage apparatus) as a 12 V power supply, and a lithium ion secondary battery as a 12 V power supply or a 48 V power supply may be mounted. While adjusting the current input/output in the lithium ion secondary battery, the power is supplied to a load (for example, an auxiliary machine) by the lead-acid battery so that the estimated value of the transient deterioration amount in the lithium ion secondary battery becomes equal to or less than a predetermined value. Alternatively, the power from the lead-acid battery may be preferentially supplied to a load (for example, an auxiliary machine). In the case of a vehicle with dual power sources, it is considered that the load will be higher than in the case of a single power source due to low-fuel consumption and high functionality and electrification of vehicle components. In the case of a dual power source, the transient deterioration of the lithium ion secondary battery has a large effect on capacity and power performance, especially on long-term output. In a low-temperature environment, the lithium ion secondary battery is likely to undergo transient deterioration, and the control method of the present invention is useful. The auxiliary energy storage device (or auxiliary energy storage apparatus) is not limited to a lead-acid battery, but may be another battery or a capacitor.

DESCRIPTION OF REFERENCE SIGNS

1 battery (energy storage device)
2 cover plate
3 case body
4 positive electrode terminal
8 negative electrode terminal
5, 9 insulating plate
6, 10 gasket
11 case
7, 12 current collector
13 electrode assembly
14 positive electrode tab
15 negative electrode tab
30 energy storage apparatus
31 BMU (deterioration amount estimation device)
32 Information processing unit
33 CPU (calculation unit, first calculation unit, second calculation unit, estimation unit, first estimation unit, second estimation unit, setting unit, adjusting unit)
34 memory
34a program
34b table
35 voltage measuring unit
36 current measuring unit
37 ECU
38 load
39 current sensor

The invention claimed is:

1. An energy storage system comprising:
an energy storage device;
a deterioration amount estimation device, comprising:
 a memory storing a program;
 a processor executing the program and configured to:
  calculate a deterioration amount of the energy storage device based on an internal resistance value; and
  estimate a transient deterioration amount based on the deterioration amount and a continuous deterioration amount that does not decrease with time and continues,
 wherein the processor calculates the continuous deterioration amount based on the internal resistance value at a time point when a reduction time, in which a decrease amount converges, has elapsed; and
an adjusting unit that adjusts an amount of current input/output in the energy storage device such that the transient deterioration amount of the energy storage device is equal to or less than a predetermined value.

2. An energy storage system comprising:
an energy storage device;
a deterioration amount estimation device, comprising:
 a central processing unit (CPU) including:
  a first calculation unit that calculates a calculated deterioration amount of the energy storage device;
  a first estimation unit that estimates a transient deterioration amount based on a calculated deterioration amount at a calculation time point and a calculated deterioration amount at a predetermined time point; and
  a second calculation unit that calculates an internal resistance value of the energy storage device,
 wherein the first calculation unit calculates the calculated deterioration amount based on the internal resistance value calculated by the second calculation unit, and
 wherein the predetermined time point is a time point when a reduction time, in which a decrease amount converges, has elapsed; and
an adjusting unit that adjusts an amount of current input/output in the energy storage device such that the transient deterioration amount of the energy storage device is equal to or less than a predetermined value.

3. The deterioration amount estimation device according to claim 2, wherein the predetermined time point is the time point when, in a case where a load is smaller than a second predetermined value, the calculated deterioration amount decreases, and the reduction time in which the decrease amount converges has elapsed, wherein a second estimation unit that estimates a continuing continuous deterioration amount based on the calculated deterioration amount calculated by the first calculation unit at the time point is included, and wherein the first estimation unit estimates the transient deterioration amount based on the calculated deterioration amount at the calculation time point and the continuous deterioration amount.

4. The deterioration amount estimation device according to claim 3, wherein the second estimation unit estimates the continuous deterioration amount when a predetermined period has elapsed and the load is smaller than the second predetermined value.

5. The deterioration amount estimation device according to claim 4, further comprising a setting unit that sets the reduction time based on a use condition of the energy storage device and a predetermined convergence value of the decrease amount.

6. An energy storage system comprising:
an energy storage device;
a deterioration amount estimation device, comprising:
a processor configured to:
calculate a deterioration amount of the energy storage device based on an internal resistance value;
estimate a continuous deterioration amount based on the deterioration amount calculated at a time point when, in a case where a load of the energy storage device is smaller than a predetermined value, the deterioration amount decreases, and a reduction time in which a decrease amount converges has elapsed; and
estimate a transient deterioration amount based on the deterioration amount and the continuous deterioration amount and
an adjusting unit that adjusts an amount of current input/output in the energy storage device such that the transient deterioration amount of the energy storage device is equal to or less than a second predetermined value.

7. A deterioration amount estimation method, comprising:
calculating a deterioration amount of an energy storage device based on an internal resistance value;
estimating a transient deterioration amount of the energy storage device based on a calculated deterioration amount and a continuous deterioration amount that does not decrease with time and continues,
wherein the continuous deterioration amount of the energy storage device is calculated based on the internal resistance value at a time point when a reduction time, in which a decrease amount converges, has elapsed; and
adjusting an amount of current input/output in the energy storage device such that the transient deterioration amount of the energy storage device is equal to or less than a predetermined value.

8. A deterioration amount estimation method, comprising:
calculating a calculated deterioration amount of an energy storage device;
estimating a transient deterioration amount of the energy storage device based on a calculated deterioration amount at a calculation time point and a calculated deterioration amount at a predetermined time point;
calculating an internal resistance value of the energy storage device,
wherein the calculated deterioration amount is calculated based on the internal resistance value that is calculated, and
wherein the predetermined time point is a time point when a reduction time, in which a decrease amount converges, has elapsed; and
adjusting an amount of current input/output in the energy storage device such that the transient deterioration amount of the energy storage device is equal to or less than a predetermined value.

9. A non-transitory computer-readable storage medium storing a computer program configured to:
calculate a deterioration amount of an energy storage device based on an internal resistance value;
estimate a transient deterioration amount based on the calculated deterioration amount and a continuous deterioration amount that does not decrease with time and continues,
wherein the continuous deterioration amount is calculated based on the internal resistance value at a time point when a reduction time, in which a decrease amount converges, has elapsed; and
adjusting an amount of current input/output in the energy storage device such that the transient deterioration amount of the energy storage device is equal to or less than a predetermined value.

10. A non-transitory computer-readable storage medium storing a computer program configured to:
estimate a calculated deterioration amount of an energy storage device;
estimate a transient deterioration amount of the energy storage device based on a calculated deterioration amount at a calculation time point and a calculated deterioration amount at a predetermined time point;
calculate an internal resistance value of the energy storage device,
wherein the calculated deterioration amount is calculated based on the internal resistance value of the energy storage device that is calculated, and wherein the predetermined time point is a time point when a reduction time, in which a decrease amount converges, has elapsed; and
adjusting an amount of current input/output in the energy storage device such that the transient deterioration amount of the energy storage device is equal to or less than a predetermined value.

11. The deterioration amount estimation device according to claim 1, wherein the deterioration amount is a difference between a current internal resistance value and an initial internal resistance value.

12. The deterioration amount estimation device according to claim 1, wherein the transient deterioration amount is a difference between the deterioration amount and the continuous deterioration amount.

13. The deterioration amount estimation device according to claim 1, wherein the deterioration amount estimation device is configured to suppress an increase in the continuous deterioration amount based on the estimated transient deterioration amount.

14. The deterioration amount estimation device according to claim 1, wherein the deterioration amount estimation device is configured to suppress an increase in the continuous deterioration amount by extracting the transient deterioration amount from the deterioration amount and performing an input/output limitation.

15. The deterioration amount estimation device according to claim 14, wherein the input/output limitation includes limiting an application target of the energy storage device.

16. The deterioration amount estimation device according to claim 2, wherein the calculated deterioration amount is a difference between a current internal resistance value and an initial internal resistance value.

17. The deterioration amount estimation device according to claim 2, wherein the transient deterioration amount is a difference between the calculated deterioration amount at the calculation time point and the calculated deterioration amount at the predetermined time point.

18. The deterioration amount estimation method according to claim 7, wherein the deterioration amount is a difference between a current internal resistance value and an initial internal resistance value, and wherein the transient deterioration amount is a difference between the deterioration amount and the continuous deterioration amount.

19. The deterioration amount estimation device according to claim 1, wherein the processor is configured to calculate the continuous deterioration amount based on the internal resistance value received from the energy storage device to suppress a deterioration of the energy storage device.

* * * * *